(12) United States Patent
Ranish et al.

(10) Patent No.: US 8,283,607 B2
(45) Date of Patent: Oct. 9, 2012

(54) APPARATUS INCLUDING HEATING SOURCE REFLECTIVE FILTER FOR PYROMETRY

(75) Inventors: Joseph M. Ranish, San Jose, CA (US); Aaron M. Hunter, Santa Cruz, CA (US); Blake R. Koelmel, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 987 days.

(21) Appl. No.: 12/100,179

(22) Filed: Apr. 9, 2008

(65) Prior Publication Data

US 2009/0255921 A1    Oct. 15, 2009

(51) Int. Cl.
*H05B 3/68* (2006.01)
*F27B 5/14* (2006.01)
*F26B 19/00* (2006.01)
*C23C 16/00* (2006.01)

(52) U.S. Cl. ............... 219/455.12; 219/390; 392/416; 118/725

(58) Field of Classification Search ............... 219/444.1, 219/455.12, 390, 405, 411; 392/411, 416, 392/418, 422; 250/492.2, 503.1, 504 R; 118/724, 725
See application file for complete search history.

(56) References Cited

U.S. PATENT DOCUMENTS

| | | | |
|---|---|---|---|
| 4,839,449 A | 6/1989 | Billmers et al. | |
| 5,226,732 A | 7/1993 | Nakos et al. | |
| 5,658,612 A | 8/1997 | Li et al. | |
| 5,843,518 A | 12/1998 | Li et al. | |
| 5,848,842 A | 12/1998 | Peuse et al. | |
| 5,960,158 A | 9/1999 | Gat et al. | |
| 6,179,466 B1 | 1/2001 | Peuse et al. | |
| 6,395,363 B1 | 5/2002 | Ballance et al. | |
| 6,803,588 B2 | 10/2004 | Kamieniecki | |
| 6,835,914 B2 | 12/2004 | Timans | |
| 6,839,507 B2 | 1/2005 | Adams et al. | |
| 6,965,092 B2 | 11/2005 | Mahawili | |
| 7,041,931 B2 | 5/2006 | Jennings et al. | |
| 7,056,389 B2 | 6/2006 | Hauf et al. | |
| 7,115,837 B2 | 10/2006 | Timans et al. | |
| 7,135,656 B2 | 11/2006 | Timans et al. | |
| 2005/0062388 A1 | 3/2005 | Camm et al. | |
| 2006/0160352 A1 | 7/2006 | Matsushita et al. | |
| 2006/0289434 A1 | 12/2006 | Timans | |
| 2007/0252500 A1 | 11/2007 | Ranish et al. | |
| 2008/0171417 A1 | 7/2008 | Ramachandran et al. | |

OTHER PUBLICATIONS

"PCT International Search Report mailed Oct. 26, 2009" for PCT/US2009/039443, 7 pgs.
"PCT International Written Opinion mailed Oct. 26, 2009" for PCT/US2009/039443, 9 pgs.
International Search Report and Written Opinion in S/N PCT/US2010/051893, mailed May 23, 2011, 10 pgs.
Non-Final Office Action in U.S. Appl. No. 12/483,770, mailed Sep. 6, 2011, 12 pgs.
Supplementary EP Search Report in EP 09 73 0361, dated Jun. 6, 2011, 5 pgs. "Final Office Action in U.S. Appl. No. 12/483,770, dated Feb. 17, 2012", 12 pgs.
"Non-Final Office Action in U.S. Appl. No. 12/483,770", dated Jun. 14, 2012, 7 pages.

*Primary Examiner* — Sang Paik
(74) *Attorney, Agent, or Firm* — Diehl Servilla LLC (57) ABSTRACT

Methods and apparatus for processing substrates and measuring the temperature using radiation pyrometry are disclosed. A reflective layer is provided on a window of a processing chamber. A radiation source providing radiation in a first range of wavelengths heats the substrate, the substrate being transparent to radiation in a second range of wavelengths within the first range of wavelengths for a predetermined temperature range. Radiation within the second range of wavelength is reflected by the reflective layer.

14 Claims, 4 Drawing Sheets

APPARATUS INCLUDING HEATING SOURCE REFLECTIVE FILTER FOR PYROMETRY

TECHNICAL FIELD

This invention relates generally to thermal processing of substrates. In particular, embodiments of the invention relate to pyrometry during rapid thermal processing of a semiconductor.

BACKGROUND

Rapid thermal processing (RTP) is a well-developed technology for fabricating semiconductor integrated circuits in which the substrate, for example, a silicon wafer, is irradiated with high-intensity optical radiation in a RTP chamber to quickly heat the substrate to a relatively high temperature to thermally activate a process in the substrate. Once the substrate has been thermally processed, the radiant energy is removed and the substrate quickly cools. As such, RTP is energy efficient because the chamber surrounding the substrate is not heated to the elevated temperatures required to process the substrate, and only the substrate is heated. In other words, during RTP, the processed substrate is not in thermal equilibrium with the surrounding environment, namely the chamber.

The fabrication of integrated circuits from silicon or other wafers involves many steps of depositing layers, photo lithographically patterning the layers, and etching the patterned layers. Ion implantation is used to dope active regions in the semiconductive silicon. The fabrication sequence also includes thermal annealing of the wafers for many uses including curing implant damage and activating the dopants, crystallization, thermal oxidation and nitridation, silicidation, chemical vapor deposition, vapor phase doping, thermal cleaning, among others.

Although annealing in early stages of silicon technology typically involved heating multiple wafers for long periods in an annealing oven, RTP has been increasingly used to satisfy the ever more stringent requirements for processing substrates with increasingly smaller circuit features. RTP is typically performed in single-wafer chambers by irradiating a wafer with light from an array of high-intensity lamps directed at the front face of the wafer on which the integrated circuits are being formed. The radiation is at least partially absorbed by the wafer and quickly heats it to a desired high temperature, for example above 600° C., or in some applications above 1000° C. The radiant heating can be quickly turned on and off to controllably heat the wafer over a relatively short period, for example, of one minute or, for example, 30 seconds, more specifically, 10 seconds, and even more specifically, one second. Temperature changes in rapid thermal processing chambers are capable of occurring at rates of at least about 25° C. per second to 50° C. per second and higher, for example at least about 100° C. per second or at least about 150° C. per second.

During certain processes, lower temperatures, for example, less than about 400° C., may be required. A temperature of a substrate in a processing chamber may be below 400° C. and may be as low as about 175° C. An example of such processes is forming silicides on silicon wafers. The quality and performance of processing a substrate such as a silicon wafer in a chamber depends in part on the ability to provide and maintain an accurate temperature setting of the wafer or substrate. Temperatures of a substrate in a processing chamber are usually measured by a pyrometer, which measures temperature within a bandwidth of wavelengths. Radiation which is within the radiation pyrometer bandwidth and which originates from the heating source can interfere with the interpretation of the pyrometer signal if this radiation is detected by the pyrometer. To some extent "leaking" heat source radiation can interfere with the pyrometer reading. In addition, not all wafers are opaque at the pyrometer bandwidth, especially when the wafer is at lower temperatures. Accordingly, improved systems and methods to measure temperatures accurately with a pyrometer are required.

SUMMARY

According to an embodiment of the invention, methods and apparatus are provided for determining a temperature of a substrate, for example, a semiconductor substrate in a processing chamber using radiation pyrometry. In one embodiment, the methods and apparatus described herein are intended to increase the accuracy of measurements of a temperature of a substrate. According to one or more embodiments, providing a reflective layer between a heat source and the substrate will increase the accuracy of pyrometry by limiting radiation of the heat source reaching the pyrometer.

In one embodiment, a system for processing a substrate, comprises a heat source, the heat source providing radiation in a first range of wavelengths; a pyrometer for measuring the temperature of the substrate disposed within a process area of the chamber by detecting radiation in a second range of wavelengths within the first range of wavelengths; and a window separating the heat source from the substrate, the window being made from a material which is substantially transparent to radiation in the first range of wavelengths and having a reflective layer covering an entire surface between the heat source and the substrate, the reflective layer being substantially reflective to radiation in the second range of wavelengths.

In a specific embodiment, the window is positioned within the chamber to prevent radiation within the second range of wavelengths from reaching the pyrometer. In one embodiment, the window includes an absorbent material that absorbs radiation substantially only in the second range of wavelengths.

In one embodiment, the reflective coating is effective to prevent radiation within the second range of wavelength from entering the process area. In one embodiment, the first range of wavelengths is between about 400-4000 nm and the second range of wavelengths is between about 700-1000 nm and wherein the window with the reflective layer is effective to prevent radiation from the heat source within the second range of wavelengths from being transmitted through a substrate being measured by the pyrometer at temperatures below about 400° C. According to a specific embodiment, the reflective layer has a transmittance ratio of reflectance to transmission of light in the second range of wavelengths of at least 1000. In one embodiment, the substrate comprises silicon.

In one embodiment, the window has a reflective layer in the second range of wavelengths on a first surface and on a second surface of the window and the ratio of reflectance applies to light radiated from the heat source with an angle of incidence of about 45 degrees or less.

In one embodiment, the reflective layer further comprises a layer of radiation absorbent material between a first and a second reflective layer, the radiation absorbent material adapted to absorb radiation in the second range wavelengths. In at least one embodiment, the heat source comprises a lamp, and the window comprises an envelope surrounding a radiation source.

In one embodiment, the system comprises a second heat source and a second window separating the second heat source from the substrate the second window being made from a material which is substantially transparent to radiation in a first range of wavelengths produced by the second heat source and having a reflective layer covering an entire surface of the second window between the second heat source and the substrate, the reflective layer being substantially reflective to radiation in a second range of wavelengths within the first range of wavelengths produced by the second heat source.

Another embodiment is directed to a system for processing a substrate comprising: a heat source, the heat source providing radiation in a first range of wavelengths; a process area for containing the substrate; a first wall of the process area being a window separating the heat source from the substrate, the window facing and substantially parallel to a first surface of the substrate; a pyrometer directed at a second surface of the substrate opposite the first surface for measuring the temperature of the substrate disposed within a process area of the chamber by detecting radiation in a second range of wavelengths within the first range of wavelengths, wherein the window is made from a material which is substantially transparent to radiation in the first range of wavelengths, a first surface of the first wall being completely covered by a reflective layer being substantially reflective to radiation in a second range of wavelengths, the second range of wavelengths being within the first range of wavelengths; and a second wall of the process area, about or substantially parallel to the first wall, and separating the process area from an outside environment, the second wall not being covered by the reflective layer.

In a specific embodiment, the window is effective to prevent radiation from reaching the pyrometer through a substrate comprising silicon at temperatures below about 400° C. The second range of wavelengths in one embodiment is between about 700-1000 nm.

Another aspect pertains to a method of measuring the temperature of a wafer in a process chamber comprising: heating a substantially flat substrate with a radiation source, the radiation source providing radiation in a first range of wavelengths, the substrate being transparent to radiation in a second range of wavelengths within the first range of wavelengths for a predetermined temperature range; measuring radiation within a process area within the chamber using a pyrometer; and reflecting radiation from the radiation source within the second range of wavelengths back towards the radiation source to prevent radiation within the second range of wavelengths from the radiation source from reaching the pyrometer.

In one embodiment of the method, the radiation source is directed at a first substrate surface and the pyrometer is directed at a second substrate surface opposite the first substrate surface.

In another embodiment of the method, the method further comprises providing a flat window separating the radiation source from the substrate and facing and substantially parallel to a first surface of the substrate, the window being made from a material which is substantially transparent to radiation in the first range of wavelengths and having a reflective layer thereon, the reflective layer being substantially reflective to radiation in the second range of wavelengths.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

According to one or more embodiments of the invention, a thermal processing chamber for processing a substrate such as a semiconductor wafer is provided. Wafer temperature is measured by radiation pyrometry. Wafer temperature can be determined through radiation pyrometry by determining the emissivity of the substrate and applying known radiation laws to calibrate a pyrometer for accurate temperature measurements. Radiation within the bandwidth or wavelength range of the pyrometer which originates from the heating source (e.g., the lamps) interferes with the interpretation of the pyrometer signal if this radiation is detected by the pyrometer. This may be due to leakage of source radiation in the chamber that reaches the pyrometer, or source radiation that reaches the pyrometer when the wafer is "transparent" to source radiation. This may occur, for example with silicon wafers during operation of the chamber at temperatures below 450° C., and as low as 150° C.

Figure 1:
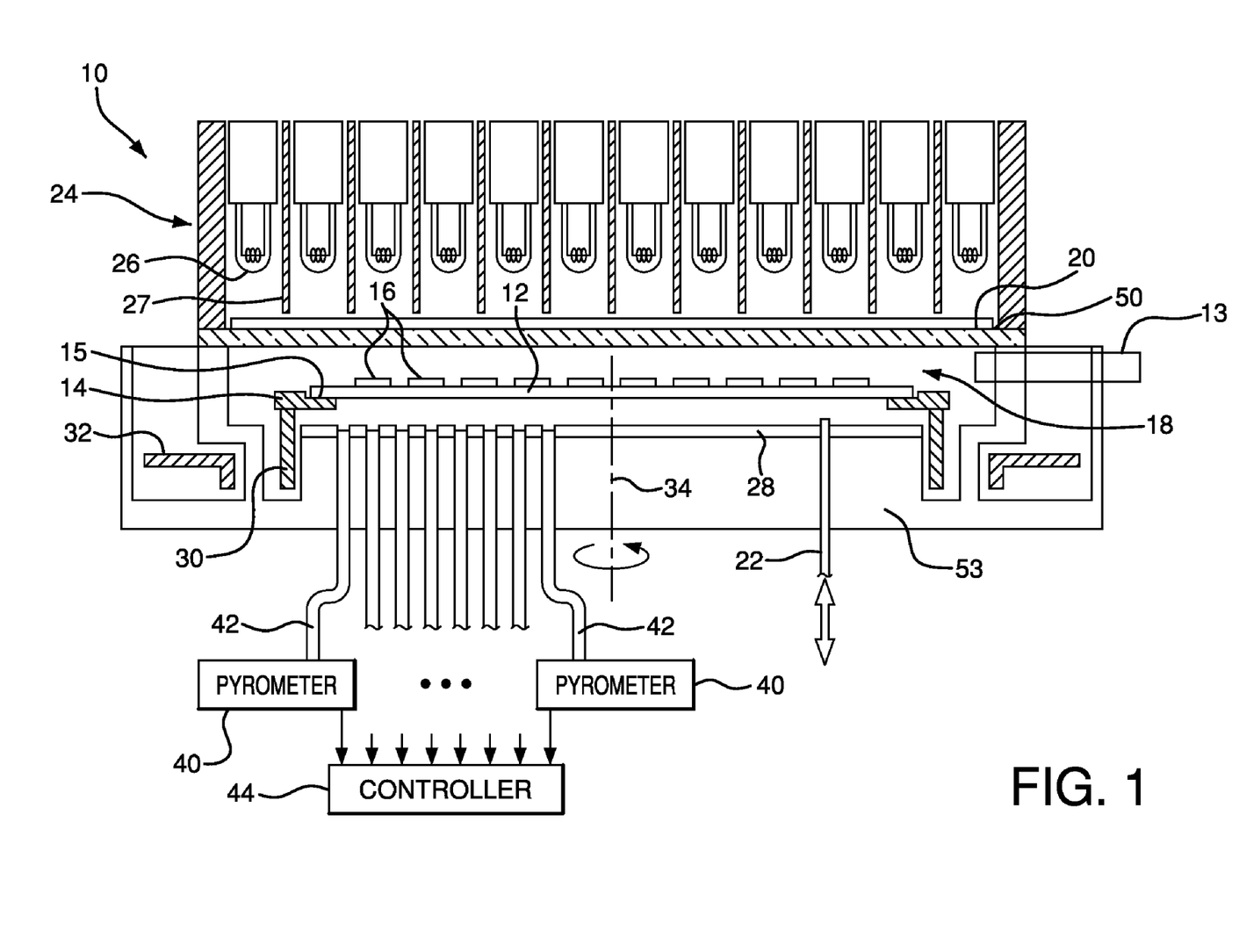
FIG. 1 shows a cross-sectional view of a rapid thermal processing chamber according to one or more embodiments.

FIG. 1 schematically represents a rapid thermal processing chamber 10. Peuse et al. describe further details of this type of reactor and its instrumentation in U.S. Pat. Nos. 5,848,842 and 6,179,466, each of these patents incorporated herein by reference in its entirety. A wafer 12, for example, a semiconductor wafer such as a silicon wafer to be thermally processed is passed through the valve or access port 13 into the process area 18 of the chamber 10. The wafer 12 is supported on its periphery by an annular edge ring 14 having an annular sloping shelf 15 contacting the corner of the wafer 12. Ballance et al. more completely describe the edge ring and its support function in U.S. Pat. No. 6,395,363, incorporated herein by reference in its entirety. The wafer is oriented such that processed features 16 already formed in a front surface of the wafer 12 face upwardly, referenced to the downward gravitational field, toward a process area 18 defined on its upper side by a transparent quartz window 20. Contrary to the schematic illustration, the features 16 for the most part do not project substantial distances beyond the surface of the wafer 12 but constitute patterning within and near the plane of the surface. Three lift pins 22 may be raised and lowered to support the back side of the wafer 12 when the wafer is handed between a paddle or robot blade (not shown) bringing the wafer into the chamber and onto the edge ring 14. A radiant heating apparatus 24 is positioned above the window 20 to direct radiant energy toward the wafer 12 and thus to heat it. In the reactor 10, the radiant heating apparatus includes a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

As used herein, rapid thermal processing or RTP refers an apparatus or a process capable of uniformly heating a wafer at rates of about 50° C./second and higher, for example, at rates of 100° to 150° C./second, and 200° to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rate of up to 100° to 150° C./second, and 200° to 400° C./second distinguishing rapid thermal processing chambers from other types of thermal chambers that do not have a heating system and heating control system capable of rapidly heating at these rates.

In accordance with a further aspect of the present invention embodiments of the present invention may be applied also to flash annealing. As used herein flash annealing refers to annealing a sample in under 5 seconds, specifically, less than 1 second, and in some embodiments, milliseconds.

It is important to control the temperature across the wafer 12 to a closely defined temperature uniform across the wafer 12. One passive means of improving the uniformity includes a reflector 28 extending parallel to and over an area greater than the wafer 12 and facing the back side of the wafer 12. The reflector 28 efficiently reflects heat radiation emitted from the wafer 12 back toward the wafer 12. The spacing between the wafer 12 and the reflector 28 is preferably within the range of 3 to 9 mm, and the aspect ratio of the width to the thickness of the cavity is advantageously greater than 20. In accordance with one aspect of the present invention a reflector plate is applied to enhance the apparent emissivity of a substrate such as a wafer. The reflector 28, which may be formed of a gold coating or multi-layer dielectric interference mirror, effectively forms a black-body cavity at the back of the wafer 12 that tends to distribute heat from warmer portions of the wafer 12 to cooler portions. In other embodiments, for example, as disclosed in U.S. Pat. Nos. 6,839,507 and 7,041,931, both incorporated herein by reference in their entireties, the reflector 28 may have a more irregular surface or have a black or other colored surface to more closely resemble a black-body wall. The black-body cavity is filled with a distribution, usually described in terms of a Planck distribution, of radiation corresponding to the temperature of the wafer 12 while the radiation from the lamps 26 has a distribution corresponding to the much higher temperature of the lamps 26. Preferably, the reflector 28 is deposited on a water-cooled base 53 preferably made of metal to heat sink excess radiation from the wafer, especially during cool down. Accordingly, the process area of the processing chamber has at least two substantially parallel walls, of which a first is a window 20, preferably made of a material being transparent to radiation such as quartz, and a second wall 53 substantially parallel to the first wall which is preferably made of metal and is significantly not transparent.

One way of improving the uniformity includes supporting the edge ring 14 on a rotatable cylinder 30 that is magnetically coupled to a rotatable flange 32 positioned outside the chamber. A motor (not shown) rotates the flange 32 and hence rotates the wafer about its center 34, which is also the centerline of the generally symmetric chamber.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a black-body held at that temperature. Pyrometry, however, is affected by the emissivity of the portion of the wafer 12 being scanned. Emissivity $\in$ can vary between 1 for a black body to 0 for a perfect reflector and thus is an inverse measure of the reflectivity R=1−$\in$ of the wafer back side. While the back surface of a wafer is typically uniform so that uniform emissivity is expected, the backside composition may vary depending upon prior processing. The pyrometry can be improved by further including a emissometer to optically probe the wafer to measure the emissivity or reflectance of the portion of the wafer it is facing in the relevant wavelength range and the control algorithm within the controller 44 to include the measured emissivity.

In the embodiment shown in FIG. 1, the separation between the substrate 12 and the reflector 28 is dependent on the desired heat flow for the given substrate 12. In one embodiment, the substrate 12 can be disposed at a greater distance from the reflector 28 to decrease the heat flow to the substrate. In another embodiment, the substrate 12 can be placed closer to the reflector 28 to increase the heat flow to the substrate 12. The exact position of the substrate 12 during the heating of the substrate 12 and the residence time spent in a specific position depends on the desired amount of heat flow to the substrate 12.

In another embodiment, when the substrate 12 is in a lower position, proximate the reflector 28, the thermal conduction from the substrate 12 to the reflector 28 increases and enhances the cooling process. The increased rate of cooling in turn promotes optimal RTP performances. The closer the substrate 12 is positioned to the reflector 28; the amount of thermal exposure will proportionally decrease. The embodiment shown in FIG. 1 allows the substrate 12 support to be easily levitated at different vertical positions inside the chamber to permit control of the substrate's thermal exposure. It will be understood that the configuration shown in FIG. 1 is not intended to be limiting. In particular, the invention is not limited to configurations in which the heat source or lamps are directed at one side or surface of the substrate and the pyrometers are directed at the opposite side of the wafer.

As noted above, wafer temperature in the process area of a processing chamber is commonly measured by radiation pyrometry. While radiation pyrometry can be highly accurate, radiation which is within the radiation pyrometer bandwidth and which originates from the heating source may interfere with the interpretation of the pyrometer signal if this radiation is detected by the pyrometer. In Applied Materials' RTP systems this minimized by the process kit and by the wafer itself. The process kit couples the wafer with the rotation system. It may include a support cylinder which is shown as 30 in FIG. 1. It may also include a support ring which is not shown in the Figures but it may be used in certain processing chamber configurations). Such a support ring is basically an auxiliary edge ring which supports the edge ring, which is shown as 14 in FIG. 1.

In general, one or more pyrometers 40 as shown in FIG. 1 may be positioned in such a way that the substrate or wafer 12 shields the radiation source 26 from the pyrometer. A substrate such as a wafer is largely transparent to radiation for wavelengths greater than or about 1100 nm. Accordingly, one way to limit heat source radiation from reaching the pyrometer is to measure radiation at wavelengths at which the substrate may be substantially opaque to the wavelength. For a silicon wafer, such wavelengths may be at about 1100 nm and lower. Nevertheless, as noted above, the process kits can "leak" source radiation and not all wafers are opaque at the pyrometer bandwidth, especially when the wafer is at lower temperatures, of about 450° C. and lower. In a further embodiment the temperature may be about 400° C. and lower. In yet a further embodiment the temperature may be about 250° C. and lower. In a further embodiment the temperature may be high and may be above the melting point of the substrate such as a wafer that is being processed in the chamber.

Figure 2:
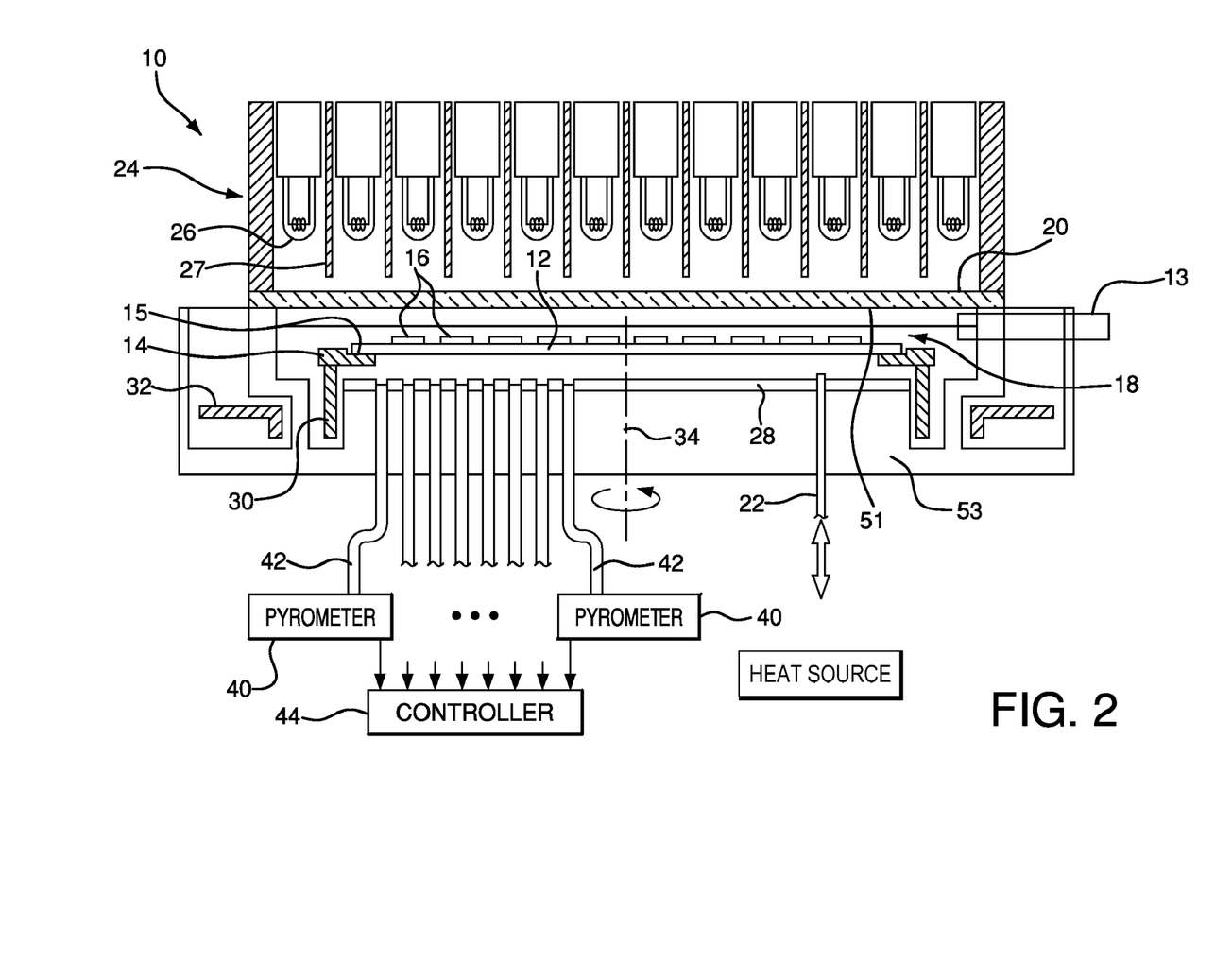
FIG. 2 shows another cross-sectional view of a rapid thermal processing chamber according to one or more embodiments.

In accordance with an embodiment of the present invention, one solution to the radiation originating from the heating source either by "leaking" or by transmitting through the substrate is to prevent the source radiation in the pyrometer bandwidth from reaching to the wafer. In accordance with a further aspect of the present invention, the radiation in the pyrometer bandwidth is reflected back to the source. This may be done by coating the window 20 in FIG. 1 that is separating the heat source from the process atmosphere 18 with a material 51 which reflects the pyrometer bandwidth radiation while permitting sufficient source radiation for heating to pass through the window 20. A film of reflective coating 50 may be placed on the side of the window facing the heat source as is shown in FIG. 1. In another embodiment, a reflective layer 51 may be placed on the side of the window 20 facing the substrate as is shown in FIG. 2. In another embodiment, a reflective layer may be applied to both sides of the window. In a specific embodiment, the entire window 20 is covered completely with a reflective layer, and there is no gap or opening in the coating. In other words, the window 20 comprising a reflective layer with no interruption in the reflective layer or the window 20 separates the substrate from the heat source. There is no transparent segment in the window 20 that disrupts or breaks the continuous reflective layer on the window 20.

By covering the window 20 with a reflective coating in a range of wavelengths at which a pyrometer is sensitive, substantially no radiation in that range of wavelengths coming directly from the heat source will reach the pyrometer. Accordingly, when the pyrometer detects radiation in the range of wavelengths it is radiation coming only or substantially only from the substrate, even when the substrate is transparent to that range of wavelengths, for example, for a silicon wafer being processed at temperatures below about 400° C., and more specifically, below about 250° C. The use of the reflective layer improves the accuracy of the pyrometer.

The window 20 in one embodiment can be removed from the chamber and be coated by one or more layers of reflective layer. The reflective behavior of the film depends on selected materials, number of layers and thickness of the layers. Processes and providers of services to provide windows with thin layers of reflective layer for reflection in specified range of wavelengths are known. One provider of such coating services is for instance JDS Uniphase. Materials that can be used in a reflective layer in an embodiment of the film may be alternating layers of, in general, any combination of high index and low index dielectric materials which are substantially transparent to most of the radiation emitted from the heating source, such as titania-silica or tantala-silica. In one embodiment the reflective layer is made up of $SiO_2$ and $Ta_2O_5$ layers, with in a further embodiment the outermost layer being $SiO_2$.

In a specific embodiment, only the window 20 as part of the process area has to be coated. Furthermore, in a specific embodiment, the window is coated completely with no openings in the layer. In one or more embodiments, the window 20 is removable. This makes servicing of the coating for repair or re-application of the film or exchange of the window with a replacement window relatively easy to do. In specific embodiments, the wall 53 is not coated.

In accordance with a further aspect of the present invention, a pyrometer will be used to measure relatively low temperatures below about 400° C. or below about 250° C. to about 175° C. by detecting radiation with the pyrometer in a range of wavelengths of about 700-1100 nm. The range of wavelengths radiated by a heat source in a processing chamber usually ranges from below 700 nm to above 5.5 micron. Materials such as quartz become opaque at wavelengths above 5.5 micron. When radiation with wavelengths between about 700-1100 nm is reflected back to the heat source sufficient radiation of other wavelengths will still be available from the source to heat the substrate to temperatures below about 400° C.

In one embodiment, the reflective layer is a broad band reflective filter. In one embodiment, it operates as a reflective filter with a maximum reflective ratio of about 100% or with a maximum reflection to transmission ratio of about not less than 1000 in a range of 700 nm-1100 nm. A relative bandwidth is defined herein as $$bw_{rel} = \frac{\lambda_{high} - \lambda_{low}}{\lambda_{center}}$$

with $\lambda_{center}$ being the wavelength at the arithmetical average of $\lambda_{high}$ and $\lambda_{low}$. Herein the $\lambda_{low}$ is determined as the wavelength where above the measured reflection is 50% of the measured incident radiation and $\lambda_{high}$ is determined as the wavelength where below the measured reflection is 50% of the measured incident radiation.

Figure 3A:
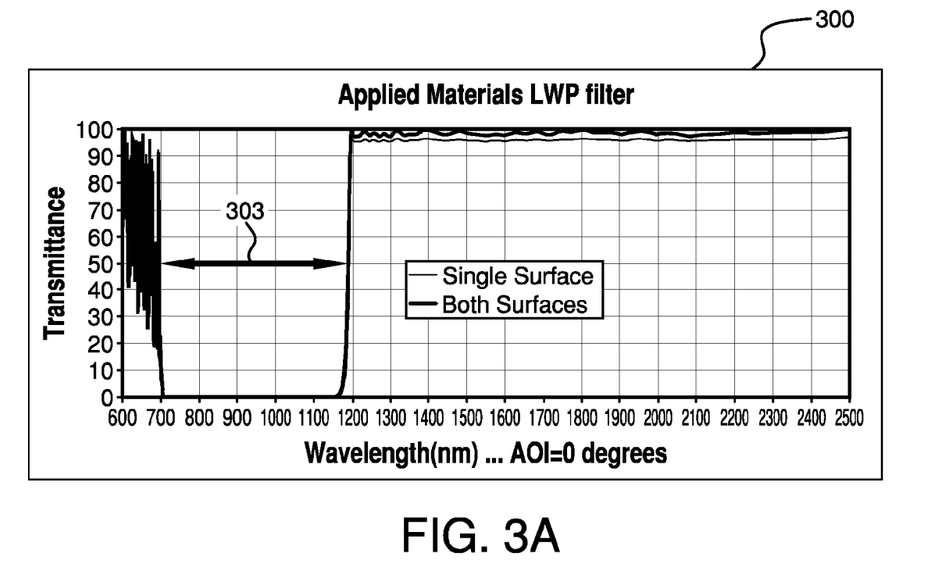
FIGS. 3A and 3B shows graphs of filter transmission versus wavelength in accordance with an aspect of the present invention.
Figure 3B:
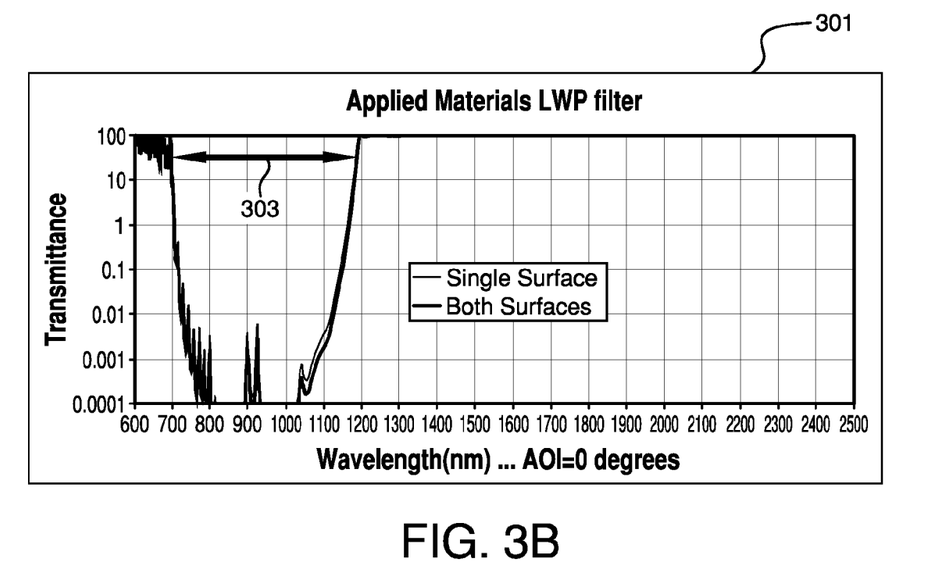

This aspect is illustrated in FIGS. 3A and 3B, which show a modeled transmittance characteristic of a filter in accordance with an aspect of the present invention. FIG. 3A shows transmittance on a linear scale as a function of wavelength. FIG. 3B shows transmittance on a logarithmic scale. Arrow 303 in both graphs identifies the 50% point for determining the relative bandwidth of this filter. The relative bandwidth of this filter is about 50%.

In one embodiment of the present invention, in a range of 700 nm-1100 nm, the relative bandwidth of the reflective layer is about 44%. In a further embodiment, the range of reflective wavelengths is about 700-1000 nm, which provides a relative bandwidth of the reflective layer of about 35%. A relative bandwidth of about 30% or higher is defined herein as a broad band, while a relative band of about lower than 30% will be defined as a narrow band. Accordingly, the bandwidth of the filter of FIGS. 3A and 3B is a broad band.

The reflective properties of a multi-layer reflective layer depend on the wavelength of the radiation. The ratio of reflection to transmission also depends on the Angle of Incidence (AOI) from a source to the surface of the film. In one embodiment a reflective layer is designed for reflection to transmission ratio based on radiation leaving a lamp with an AOI not greater than 45°.

In one embodiment, a filter which passes most source radiation and reflects the pyrometer bandwidth radiation is placed on either the outside or inside or on both surfaces of a window separating a heating source from the process chamber has been provided above. As used herein, the term "window" refers to material between the substrate and the heat source. In embodiments in which the heat source is a lamp, the term window is intended to include the lamp envelope which is typically made from quartz or any other suitable material.

Figure 4:
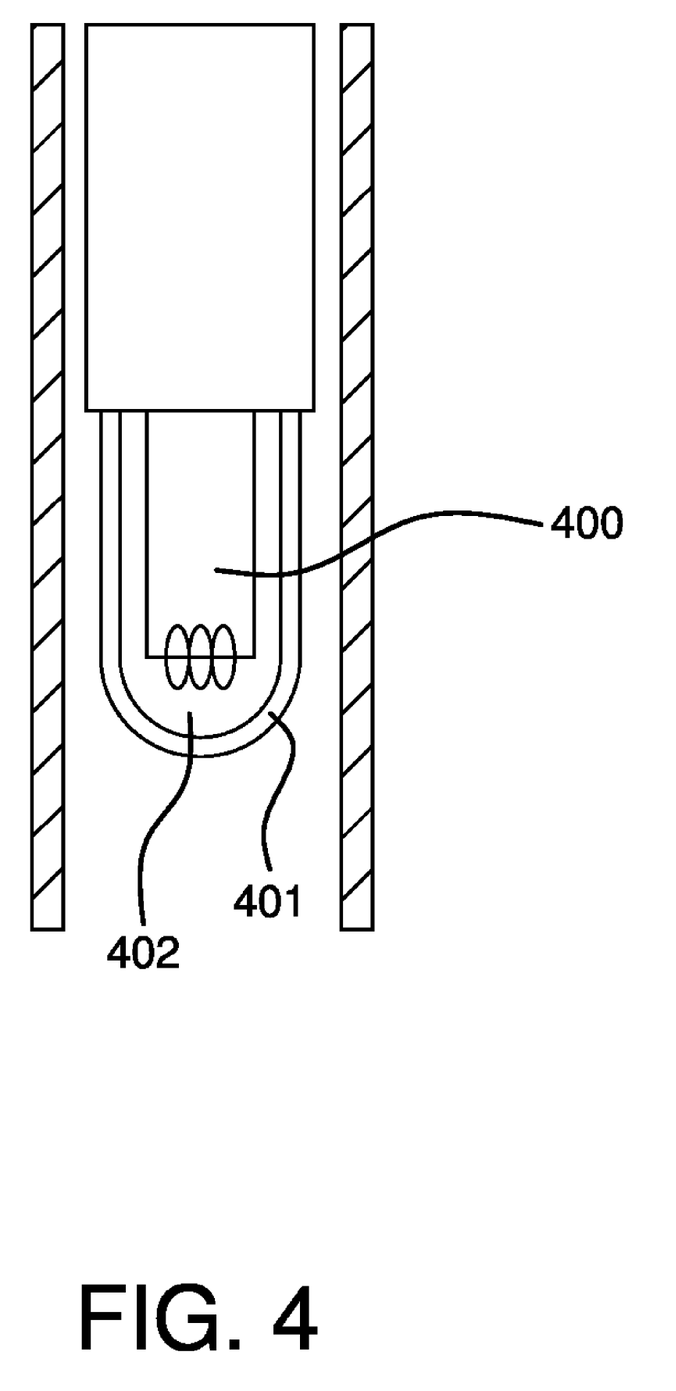
FIG. 4 shows a cross-sectional view of a heat source in accordance with an aspect of the present invention.

Thus, in a further embodiment, the filter may also be placed on the inner or outer surface of an envelope of a radiation source or on both surfaces. An illustration of this aspect is shown in FIG. 4 with a layer 401 external to an enveloped 402 on a lamp 400. This has as an added benefit that it may raise the efficiency of the heat source.

In a further embodiment, the performance of a pyrometer in a designated range of wavelengths may be improved by adding an absorber material to the reflective layer, preferably in a layer between two reflecting layers of the film. The absorber may also be part of the substrate to which a reflective layer is applied, in the form of a dopant or added material. Thus, the substrate to which the layer is applied may be partly absorptive. The substrate to which the reflective layer is applied may also be doped with a material that enhances absorptive properties of the substrate. The substrate with the reflective layer preferably is a window such as window 20 in FIGS. 1 and 2. In other embodiments, an absorbing fluid may be provided between a pair of window panes. The absorber does have to absorb somewhat in the pyrometer bandwidth, but can absorb in other spectral regions though preferably not so much in the radiation source region. Since the two reflecting films will act as a hall of mirrors for the pyrometer bandwidth, the net effect of the absorption will be magnified. Any material absorbing radiation in the pyrometer bandwidth, to an amount of some but less than a few % over the radiation spectrum passing through quartz (~0.4 to 4 microns), will be suitable. In one embodiment rare earth oxides are an excellent candidate for being added as an absorber material to the reflective layer or substrate. In a further embodiment, a band pass absorber (such as Si) that passes more source radiation than pyrometer radiation may be added to the layer or substrate. In yet a further embodiment, a general absorptive material may be added to the layer, for example, carbon, metals, other oxides miscible with the layer materials or window (substrate) material. Window materials may include quartz, alumina, yttria, glasses, or other substantially transparent ceramics.

In a further embodiment, a window such as the window 20 of FIGS. 1 and 2 may be a composite window comprising two windows, which may be provided with a gap between the windows. Both windows in a composite window are transparent to a broad range of radiation, except for a first wavelength band of radiation inside the broad range for which a window is absorptive. This can be achieved by doping a window with low levels of an absorber. The outside faces (where "inside" is defined as between the two windows) coated with the reflective coating which is reflective to substantially radiation in the first wavelength band of radiation. In this embodiment, as the light passes through the first outside coating, it then needs to pass through the first window of the composite window, a gap, the second window of the composite window, reflect off of the second window's coating, pass back through the second window, the gap, and back through the first window again, etc. This configuration maximizes the number of times light would have to pass through a window (with absorber) per reflection—2 passes per one reflection—and in turn minimizes the amount of absorber that is needed.

As a further embodiment of a window, a composite window of two or more windows is provided. A gap may exist between two windows. Such a gap may be filled with a light absorbing liquid. The windows may be transparent and reflectively coated at the outside as was explained above.

As yet a further embodiment of a composite window, comprising at least a first and a second window, a first outside window may be a transparent window. A second window with a reflective coating may be positioned between the process area and the first window. The first window may provide protection of chemical and/or mechanical wear of the second window and/or its coating.

It will be understood that in the figures, the heat source is positioned above the substrate and the pyrometer is placed below the heat source. Other configurations of the processing chamber are possible and are fully contemplated and within the scope of this invention. For instance, a processing chamber may have a heating source below a substrate and a pyrometer positioned above a heat source. These and other variations of positioning of substrate, heat source and pyrometer in a processing chamber are possible and contemplated without fundamentally affecting aspects of the inventions described herein.

In a further embodiment, a second wall 53, as shown in FIGS. 1 and 2, may comprise a window that is transparent to radiation instead of a metal wall. Such a second window is preferably substantially transparent to heating radiation, which may be provided by a second lamphead which has a similar function as lamphead 24 in FIGS. 1 and 2. The second window being substantially parallel to a substrate such as a wafer and which separates the process area from the second lamphead. Accordingly, in such a configuration the substrate such as a wafer can be heated from at least two sides. The second window in yet another embodiment may have a reflective layer, which may be in one of the configurations or embodiments of the first window. In an embodiment that includes two windows with two lampheads, thus exposing a substrate such as a wafer to radiation at two surfaces, the set-up of the pyrometer may also be modified. In a further embodiment, a pyrometer can be located in or on or behind a wall that is substantially perpendicular to a window with a reflective layer as was disclosed earlier. In that case the pyrometer is looking at a substrate such as a wafer from a side, rather than from above or below. In order to capture sufficient radiation from a substrate one can use several embodiments of positioning a pyrometer. In a further embodiment the pyrometer may be positioned in or behind an opening of a side wall located in a plane parallel to the substrate such as a wafer, the plane being higher or lower than the level of the substrate.

This allows the pyrometer to look at the substrate under an angle, thus allowing capturing sufficient radiation from a surface of the substrate. In a further embodiment, a light pipe, such as a quartz tube, may be inserted through a hole in a side wall from into the process area of the chamber. The hole being in a plane parallel to the substrate and the plane being above or below the plane of the substrate. A light pipe may be arranged in such a way that the end of the light pipe in the process area is parallel to a surface of the substrate. In another embodiment of the light pipe, the light pipe may be entering the process area parallel to a surface of the substrate such as a wafer. The light pipe can be provided with a bend at the side inside the process chamber so that it is substantially perpendicular to and above or below the surface of the substrate.

In yet a further embodiment, in embodiments having two windows with two lampheads or heating sources, both windows may be doped with an absorber and coated with a reflective coating. In yet a further embodiment of a chamber having two windows and two lampheads or heating sources, each window may be a composite window as described above.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A system for processing a substrate, comprising:
   a heat source, the heat source providing radiation in a first range of wavelengths;
   a pyrometer for measuring the temperature of the substrate disposed within a process area of the chamber by detecting radiation in a second range of wavelengths within the first range of wavelengths; and
   a window separating the heat source from the substrate, the window being made from a material which is transparent to radiation in the first range of wavelengths and having a single reflective coating covering an entire surface between the heat source and the substrate, the entire surface selected from only a side of the window facing the heat source, the reflective coating being reflective to radiation in the second range of wavelengths, wherein the window is effective to prevent radiation within the second range of wavelengths from being transmitted to the pyrometer, and wherein the first range of wavelengths is between about 400-4000 nm and the second range of wavelengths is between about 700-1000 nm and wherein the window having the reflective coating is effective to prevent radiation from the heat source within the second range of wavelengths from being transmitted through a substrate at temperatures below about 400° C. and wherein the reflective coating has a transmittance ratio of reflectance to transmission of light in the second range of wavelengths of at least 1000.

2. The system of claim 1, wherein the window is positioned within the chamber to prevent radiation within the second range of wavelengths from reaching the pyrometer.

3. The system of claim 2, wherein the reflective coating is effective to prevent radiation within the second range of wavelength from entering the process area.

4. The system of claim 1, wherein the heat source comprises a lamp, and the window comprises an envelope surrounding a radiation source.

5. The system of claim 1, further comprising a second heat source and a second window separating the second heat source from the substrate the second window being made from a material which is transparent to radiation in a first range of wavelengths produced by the second heat source and having a reflective layer covering an entire surface of the second window between the second heat source and the substrate, the reflective layer being reflective to radiation in a second range of wavelengths within the first range of wavelengths produced by the second heat source.

6. A system for processing a substrate, comprising:
   a heat source, the heat source providing radiation in a first range of wavelengths;
   a pyrometer for measuring the temperature of the substrate disposed within a process area of the chamber by detecting radiation in a second range of wavelengths within the first range of wavelengths; and
   a window separating the heat source from the substrate, the window consisting essentially of a material which is transparent to radiation in the first range of wavelengths and a reflective coating covering an entire surface between the heat source and the substrate, the reflective coating being reflective to radiation in the second range of wavelengths effective to prevent radiation within the second range of wavelengths from being transmitted to the pyrometer, the reflective coating in the second range of wavelengths on a first surface and on a second surface of the window, and wherein the reflective coating has a transmittance ratio of reflectance to transmission of light in the second range of wavelengths of at least 1000 and wherein the window having the reflective coating is effective to prevent radiation from the heat source within the second range of wavelengths from being transmitted through a substrate at temperatures below about 400° C.

7. A system for processing a substrate, comprising:
   a heat source, the heat source providing radiation in a first range of wavelengths;
   a process area for containing the substrate;
   a first wall of the process area being a window separating the heat source from the substrate, the window facing and substantially parallel to a first surface of the substrate;
   a pyrometer directed at a second surface of the substrate opposite the first surface to measure the temperature of the substrate disposed within a process area of the chamber by detecting radiation in a second range of wavelengths within the first range of wavelengths, wherein the window consists essentially of a material which is transparent to radiation in the first range of wavelengths, a surface of the first wall being completely covered by a reflective layer being reflective to radiation in the second range of wavelengths, the surface of the first wall selected from only a side of the window facing the heat source, wherein the reflective layer has a transmittance ratio of reflectance to transmission of light in the second range of wavelengths of at least 1000; and a second wall of the process area, about or substantially parallel to the first wall, and separating the process area from an outside environment, the second wall not being covered by the reflective layer.

8. The system of claim 7, wherein the window is effective to prevent radiation from the heat source within the second range of wavelengths from being transmitted through a substrate comprising silicon and being measured by the pyrometer at temperatures below about 400° C.

9. The system of claim 8, wherein the second range of wavelengths is between about 700-1000 nm.

10. A method of measuring the temperature of a wafer in a process chamber comprising:

heating a substantially flat substrate with a radiation source through a window, the radiation source providing radiation in a first range of wavelengths, the substrate being transparent to radiation in a second range of wavelengths within the first range of wavelengths for a predetermined temperature range below about 400° C.;

measuring radiation within a process area within the chamber using a pyrometer; and reflecting radiation from the radiation source within the second range of wavelengths with a reflective coating on a surface of the window back towards the radiation source to prevent radiation from the heat source within the second range of wavelengths from the radiation source from reaching the pyrometer, the surface of the window selected from only a side of the window facing the radiation source, and the window consisting essentially of a material that is transparent to radiation in the first range of wavelengths and the coating.

11. The method of claim 10, wherein the radiation source is directed at a first substrate surface and the pyrometer is directed at a second substrate surface opposite the first substrate surface.

12. The method of claim 11, wherein the window is a flat window separating the radiation source from the substrate and facing and substantially parallel to a first surface of the substrate.

13. The method of claim 10, wherein the substrate comprises silicon and the second range of wavelengths is between about 700-1000 nm.

14. The method of claim 10, wherein the radiation source is a lamp including an envelope surrounding a heat source further comprising a reflective layer on the envelope, the reflective layer being substantially reflective to radiation in the second range of wavelengths.

* * * * *